(12) United States Patent
Hannig

(10) Patent No.: US 10,561,039 B2
(45) Date of Patent: Feb. 11, 2020

(54) FRAME FOR PRINTED CIRCUIT BOARD SUPPORT IN HIGH VIBRATION

(71) Applicant: John Michael Hannig, Fort Collins, CO (US)

(72) Inventor: John Michael Hannig, Fort Collins, CO (US)

(73) Assignee: Woodward, Inc., Fort Collins, CO (US)

( * ) Notice: Subject to any disclaimer, the term of this patent is extended or adjusted under 35 U.S.C. 154(b) by 357 days.

(21) Appl. No.: 15/243,690

(22) Filed: Aug. 22, 2016

(65) Prior Publication Data

US 2018/0054912 A1    Feb. 22, 2018

(51) Int. Cl.
*H05K 7/18* (2006.01)
*H05K 7/14* (2006.01)
*H05K 7/20* (2006.01)
*H05K 1/14* (2006.01)
*H05K 1/02* (2006.01)

(52) U.S. Cl.
CPC .............. *H05K 7/18* (2013.01); *H05K 1/144* (2013.01); *H05K 7/142* (2013.01); *H05K 7/1417* (2013.01); *H05K 7/1422* (2013.01); *H05K 7/20009* (2013.01); *H05K 1/0271* (2013.01); *H05K 2201/0133* (2013.01); *H05K 2201/042* (2013.01); *H05K 2201/10409* (2013.01); *H05K 2201/2018* (2013.01)

(58) Field of Classification Search
CPC .. H05K 5/02; H05K 7/14; H05K 7/20; H05K 7/20418; H05K 7/20854; H05K 7/20445; H05K 2201/2045; B60R 16/0239; G06F 1/185; G06F 1/187; F16F 15/02; H01L 41/053

USPC ...................................... 361/690; 439/2, 382
See application file for complete search history.

(56) References Cited

U.S. PATENT DOCUMENTS

| | | | |
|---|---|---|---|
| 3,007,997 A | 11/1961 | Panariti | |
| 3,083,259 A | 3/1963 | Wells | |
| 4,053,943 A * | 10/1977 | Galvin | H05K 1/0271 188/266 |
| 4,386,390 A | 5/1983 | Hammond | |
| 4,694,555 A | 9/1987 | Russell et al. | |
| 4,768,286 A | 9/1988 | Ketcham | |
| 5,307,508 A | 4/1994 | Rollins et al. | |
| 5,473,507 A * | 12/1995 | Schwegler | G06F 1/183 361/679.4 |
| 5,504,940 A | 4/1996 | Hahs, Jr. et al. | |

(Continued)

FOREIGN PATENT DOCUMENTS

| CN | 1177904 | 4/1998 |
|---|---|---|
| CN | 103108488 | 5/2013 |

(Continued)

*Primary Examiner* — Mandeep S Buttar
(74) *Attorney, Agent, or Firm* — Reinhart Boerner Van Deuren P.C.

(57) ABSTRACT

A frame for dampening vibrations in a printed circuit board (PCB) assembly is provided. The frame includes a substrate having a first surface and a second surface and multiple ridges extending from at least one of the first and second surfaces. The ridges define recesses, and at least one of the recesses is configured to accommodate an electronic component of a PCB in the PCB assembly. Also provided is a PCB assembly including a PCB and the frame.

19 Claims, 5 Drawing Sheets

(56) References Cited

U.S. PATENT DOCUMENTS

| | | | | |
|---|---|---|---|---|
| 6,009,325 A | * | 12/1999 | Retzer | H04W 76/20 |
| | | | | 455/434 |
| 6,054,520 A | * | 4/2000 | Washio | C08K 3/38 |
| | | | | 524/404 |
| 6,099,325 A | * | 8/2000 | Parkhill | H01R 9/2466 |
| | | | | 361/707 |
| 6,233,816 B1 | | 5/2001 | Franke et al. | |
| 6,288,866 B1 | | 9/2001 | Butler et al. | |
| 6,797,880 B2 | | 9/2004 | Kirchberger et al. | |
| 7,357,886 B2 | * | 4/2008 | Groth | B29C 33/3835 |
| | | | | 264/225 |
| 8,226,874 B2 | * | 7/2012 | Huffstutler | H05K 3/284 |
| | | | | 264/272.11 |
| 2004/0155308 A1 | * | 8/2004 | McFadden | H05K 9/0024 |
| | | | | 257/422 |
| 2005/0093201 A1 | * | 5/2005 | Groth | B29C 33/3835 |
| | | | | 264/219 |
| 2009/0027859 A1 | * | 1/2009 | Giacoma | H01L 21/50 |
| | | | | 361/709 |
| 2009/0050753 A1 | * | 2/2009 | Gabriel | H02G 3/32 |
| | | | | 248/49 |
| 2010/0309631 A1 | * | 12/2010 | Hill | G06F 1/203 |
| | | | | 361/705 |
| 2011/0108312 A1 | | 5/2011 | Becze et al. | |
| 2013/0114217 A1 | | 5/2013 | Baba et al. | |
| 2014/0098509 A1 | * | 4/2014 | Tomoe | H04M 1/0277 |
| | | | | 361/803 |

FOREIGN PATENT DOCUMENTS

| | | |
|---|---|---|
| DE | 10 2014 207039 | 10/2014 |
| EP | 0 833 466 A2 | 4/1998 |
| EP | 1 672 972 A1 | 6/2006 |
| EP | 2 549 842 A1 | 1/2013 |
| TW | 361778 | 6/1999 |
| WO | WO 2013/011106 A2 | 1/2013 |

* cited by examiner

FRAME FOR PRINTED CIRCUIT BOARD SUPPORT IN HIGH VIBRATION

FIELD OF THE INVENTION

This invention generally relates to a device for vibration dampening and more particularly to a device for dampening vibrations in electrical equipment in industrial settings.

BACKGROUND OF THE INVENTION

Vibration related failures in electronic systems are typically caused by high acceleration levels, high stress levels, and large displacement amplitudes. Typically, in electronic assemblies, printed circuit boards (PCBs) are mounted directly to the housing of the electronic assembly, which saves cost and part count. However, it allows for the direct transmission of vibration energy from the housing to the PCB. High acceleration levels at the PCB are driven by direct transmission of energy levels from the surrounding environment. These levels are then amplified by PCB resonance and transmissibility as well as by unsupported large and/or high mass components. Under such conditions, a 20 g RMS input can be amplified to 90 g as a result of PCB resonance for on-engine electronics. Stress levels at the PCB and components increase proportionally with vibration levels. Large displacement amplitudes are directly related to resonance of unsupported PCB spans. Large displacements typically result in higher stress levels at electronic component mountings on the PCB and at locations where the PCB is mounted to the housing.

The transmissibility of a PCB (i.e., the ratio of output acceleration to input acceleration excitation) is generally very high. Typically, the transmissibility is on the order of from 20 to 80, indicating that transmissibility is one of the main causes for failure as a result of vibration in component parts mounted on PCBs. FIG. 7 depicts a conventional PCB assembly 100. As can be seen, two PCBs 102 are suspended on a chassis 104. Fasteners 106 attach the PCBs 102 to standoff mounts 108 on the chassis 104. Thus, the PCBs 102 are directly attached to the chassis 104, and therefore, vibrations from the engine are directly transmitted to the PCBs 102 through the chassis 104.

Various attempts have been made to reduce the transmission of vibrations to PCBs. For instance, some of the prior approaches use potting materials or complicated mechanical assemblies to provide PCB support and/or damping. Potting materials, when used in significant volume or in a volumetrically captive design, create issues with matching coefficients of thermal expansion between materials, resulting in the introduction of mechanical stresses as a result of temperature change. With respect to prior mechanical assemblies, the moving parts tend to wear over time and produce metallic dust that interferes with electronics operation. Other prior approaches include utilizing pads that "float" the PCBs so as to isolate them from housings. These pads can add significant cost to the assembly. Additionally, some prior designs use routings through the PCB in close proximity to sensitive components in order to provide strain relief local to those components.

Generally, prior approaches suffer from one or more of the following disadvantages. Some require hand operated machining for the custom molding of parts to conform to PCB geometry, which is labor intensive, difficult to mass produce, and time consuming. The use of potting materials with high coefficients of thermal expansion can cause issues with PCB assemblies, as discussed above. The use of die-cut or custom foam parts is generally expensive in electronics assemblies. Laminates tend to limit component application to one side of the PCB and/or change industry standard manufacturing processes. Some approaches require non-traditional PCB routings/holes that would be difficult for layout, and mechanical assemblies with moving parts or pre-loaded bonds could fail prior to end-of-life of the product.

Accordingly, a device that reduces or dampens vibrations in PCB assemblies, especially in assemblies mounted in industrial settings, and that does not include the same drawbacks as other prior approaches would be desirable. Embodiments of the present disclosure provide such a vibration dampening device for PCB assemblies. These and other advantages of the invention, as well as additional inventive features, will be apparent from the description of the invention provided herein.

BRIEF SUMMARY OF THE INVENTION

In one aspect, embodiments of a frame for dampening vibrations in a printed circuit board (PCB) assembly are provided. In such embodiments, the frame includes a substrate having a first surface and a second surface and a plurality of ridges extending from at least one of the first and second surfaces. The plurality of ridges define one or more recesses. At least one of the one or more recesses is configured to accommodate one or more electronic components of a PCB in the PCB assembly.

In another aspect, embodiments of a printed circuit board (PCB) assembly are provided. The PCB assembly includes at least one PCB and a frame. Each of the at least one PCB includes one or more electronic components. The frame includes a substrate having a first surface and a second surface and a plurality of ridges extending from at least one of the first and second surfaces. The plurality of ridges define one or more recesses, and at least one of the one or more recesses is configured to accommodate an electronic component of the at least one PCB on a surface of the at least one PCB facing the frame.

Other aspects, objectives and advantages of the invention will become more apparent from the following detailed description when taken in conjunction with the accompanying drawings.

BRIEF DESCRIPTION OF THE DRAWINGS

The accompanying drawings incorporated in and forming a part of the specification illustrate several aspects of the present invention and, together with the description, serve to explain the principles of the invention. In the drawings.

While the invention will be described in connection with certain preferred embodiments, there is no intent to limit it to those embodiments. On the contrary, the intent is to cover all alternatives, modifications and equivalents as included within the spirit and scope of the invention as defined by the appended claims.

DETAILED DESCRIPTION OF THE INVENTION

Embodiments of a frame for supporting a printed circuit board (PCB) are provided. The frame can be incorporated into a PCB assembly to reduce the transmission of vibration and mechanical shock from a chassis mount to the PCB. In embodiments, the frame increases the resonant frequency of the PCB(s) in the PCB assembly, reduces the peak shear strain at the PCB(s), and/or reduces peak deflection of the PCB(s). Accordingly, the embodiments of the frame for supporting a PCB are able to reduce the occurrences of random vibration failures in electronic assemblies mounted to substrates that experience industrial-level vibrations. These and other advantages will be recognized by a person having ordinary skill in the art based on the following disclosure. While embodiments may be described in a certain context or for a certain application, a person having ordinary skill in the art will readily appreciate that the described frame for supporting a PCB can be used in other contexts and applications.

Figure 1:
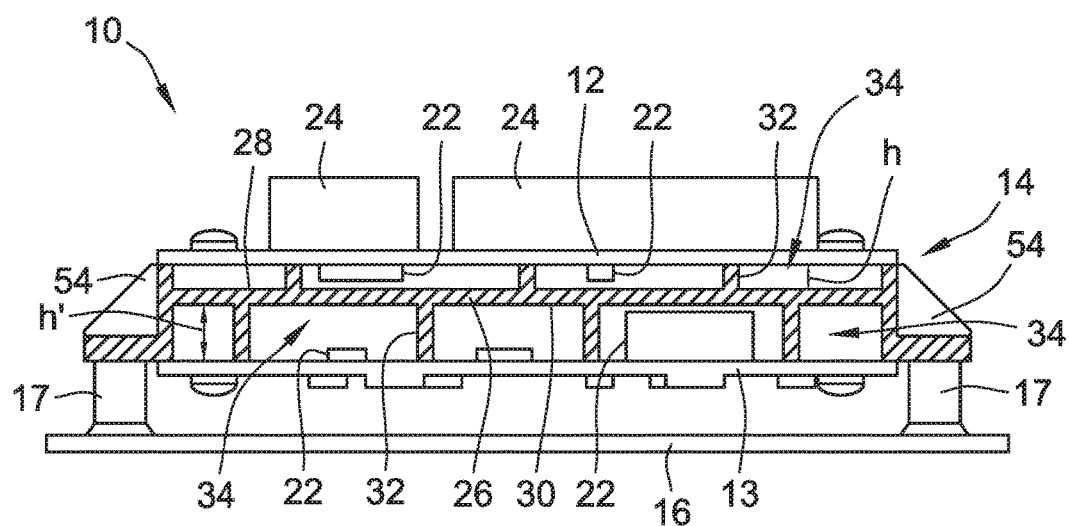
FIG. 1 is a cross-sectional view of a PCB assembly including a vibration dampening frame according to an exemplary embodiment.

FIG. 1 depicts a PCB assembly 10, including an upper PCB 12 and a lower PCB 13 mounted to a frame 14. In the embodiment shown, the PCB assembly 10 is mounted to a chassis 16 via standoff mounts 17. The chassis 16 can be attached to or supported on, for instance, the housing of an electrical assembly (not shown), or the chassis 16 can be a wall of the housing of the electrical assembly itself. In an application of a disclosed embodiment, the electrical assembly, including the PCB assembly 10, is attached to an engine (not shown) or to a mount (not shown) supporting or mechanically attached to the engine. Additionally, for instance, the electronic assembly could also be part of a valve or actuator assembly mounted at the valve on the inlet, exhaust, cooling, or fuel delivery piping of the engine. Thus, the electrical assembly tends to experience vibrations as a result of engine operation that are transmitted from the engine (e.g., through the mount) to the electrical assembly.

Within the PCB assembly, each PCB 12, 13 has an upper surface and a lower surface (with upper and lower being relative to the orientation of the PCBs as depicted in FIG. 1). The PCBs 12, 13 include a plurality of through holes or vias (not shown) into which electronic components 22 can be mounted, soldered, or otherwise attached. Electrical connections between the through holes or vias provide electrical communication between the electronic components 22 of the PCBs 12, 13. The electrical connections are typically copper paths created in the layers of the PCBs 12, 13. The copper paths can be layered at different levels of the PCBs 12, 13 such that a plurality of different paths can be defined and electrically insulated from each other.

A variety of electronic components 22 can be mounted to the PCBs 12, 13, including resistors, potentiometers, capacitors, inductors, crystals/oscillators, transformers, batteries, fuses, diodes, transistors, bridge rectifiers, integrated circuits, etc. Moreover, electrical connections can be made between the upper PCB 12 and the lower PCB 13, such as through wires or cables that connect the PCBs 12, 13. As depicted in FIG. 1, the electronic components 22 can, and typically do, have a variety of different heights relative to one another. Also as depicted in FIG. 1, the upper PCB 12 includes a plurality of terminals 24, such as spring cage terminals, and discrete wires on its upper surface to provide electrical communication to other PCBs, electrical assemblies, controllers, user interfaces, etc.

As discussed, FIG. 1 depicts an upper PCB 12 and a lower PCB 13, with the frame 14 therebetween. The upper surface of the lower PCB 13 and the lower surface of the upper PCB 12 are directed towards the frame 14. The frame 14 includes a generally planar substrate 26 having an upper surface 28 and a lower surface 30. A plurality of ridges 32 extend transversely from both of the upper surface 28 and the lower surface 30. However, in other embodiments, the ridges 32 can extend from only a single surface, i.e., just one of the upper surface 28 or lower surface 30. The frame 14 is preferably made from an electrically non-conductive material such that the PCB 12, 13 can be densely populated with electronic components 22 without experiencing electrical interference as a result of including the frame 14. In embodiments, the frame 14 is made from a plastic material and more preferably from a glass-filled plastic material. In a specific embodiment, the frame 14 is made from glass-filled polyamide. In a more specific embodiment, the frame is made from 25% glass-filled polyamide 6/6. Additionally, in preferred embodiments, the frame 14 is an injection molded piece. Using injection molding enhances the reproducibility of the frame 14 because molds can be made for specific frame 14 configurations.

Additionally, as shown in FIG. 1, the ridges 32 can extend a height h from the upper surface 28 that is different than the height h' from the lower surface 30; however, in embodiments, the height h can be equal to the height h'. The ridges 32 define a plurality of recesses 34. The recesses 34 are designed to accommodate the electronic components 22 that extend from the upper surface of the lower PCB 13 and the lower surface of the upper PCB 12. The shape of the recesses 34 defined by the ridges can be the same or different across each surface 28, 30 of the frame 14, i.e., the recesses 34 can include a variety of rectangular, square, triangular, or other polygonal or arcuate shapes. Generally, the shape and size of a recess 34 will be selected based on the shape and size of the component that the recess 34 is designed to accommodate.

As shown in FIG. 1, the ridges 32 extending from the upper surface 28 of the substrate 26 have the same height h and all the ridges 28 extending from the lower surface 30 of the substrate 26 have the same height h'. However, in other embodiments, the substrate 26 can be a tiered structure such that the heights h, h' of the ridges 32 can vary across the upper and lower surfaces 28, 30. Generally, because the recesses 34 are designed to accommodate electronic components 22, the height h or height h' of the ridges 32 will be selected to match the tallest electronic component 22 mounted to the surface of the PCB 12, 13 facing the frame 14.

Figure 2:
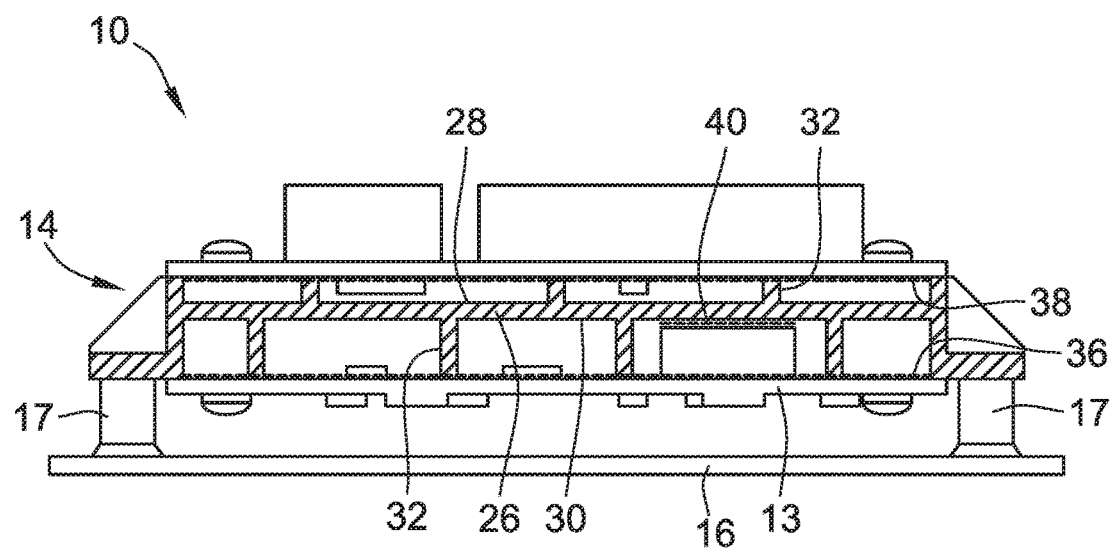
FIG. 2 is a cross-sectional view of a PCB assembly including an elastomeric material at an interface between the PCBs and frame according to an exemplary embodiment.

The frame 14 and the PCBs 12, 13 are in close spatial relationship such that a plurality of interfaces are created where the ridges 32 approach the PCBs 12, 13 and/or where the electrical components 22 approach the frame 14. As depicted in FIG. 2, the upper surface of the lower PCB 13 forms a first interface 36 with the peaks of the ridges 32 extending from the lower surface 30 of the substrate 26 of the frame 14. Further, the lower surface of the upper PCB 12 forms a second interface 38 with the peaks of the ridges 32 extending from the upper surface 28 of the substrate 26 of the frame 14. A third interface 40 is formed between the lower surface 30 of the substrate 26 of the frame 14 and the top of an electronic component 22 mounted on the upper surface of the lower PCB 13. A fourth interface could also be formed between the upper surface 28 of the substrate 26 of the frame 14 and an electronic component 22 mounted on the lower surface of the upper PCB 12, but in the embodiments depicted in the Figures, no electronic component 22 is in sufficiently close proximity with the upper surface 28 of the substrate 26 to form such an interface; nevertheless, a fourth interface could be created depending on the selection of electronic components 22 for the upper PCB 12 and depending on the height h of the ridges 32.

Because the frame 14 and one or more electronic components 22 may be in contact (as in the case of the third interface 40 or the possible fourth interface), the frame 14 is preferably reasonably thermally conductive (e.g., greater than 0.2 W/mK) and can act as a heatsink for electronic components 22 with moderate dissipation. In the case of an electronic component 22 with intermittent transient thermal spikes, a heat spreader (not shown), such as a copper or aluminum plate, strips, meshes, etc., could be molded into the frame 14 to facilitate the transfer of heat away from the electronic component 22.

Figure 3:
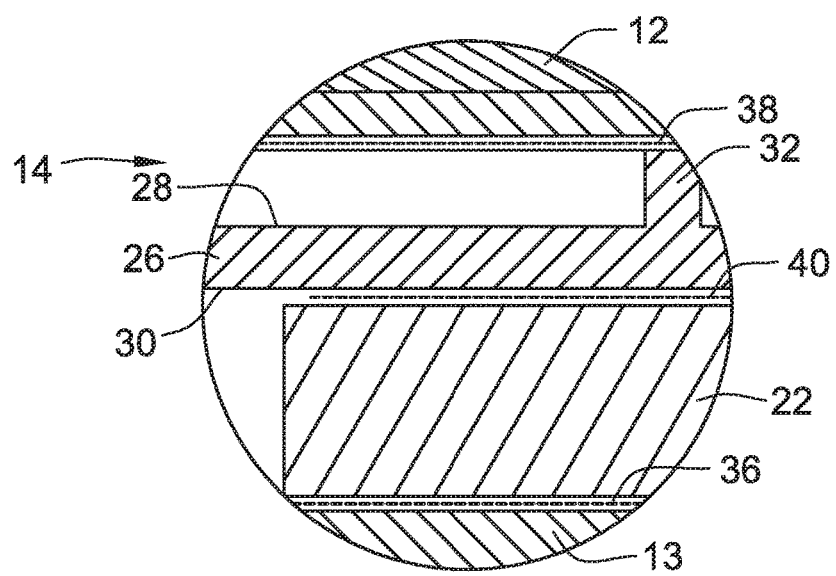
FIG. 3 is a detail view of the interface between the PCBs and frame of the PCB assembly in FIG. 2 according to an exemplary embodiment.

FIG. 3 provides a magnified view of the interfaces 36, 38, 40. In embodiments, the interfaces 36, 38, 40 are created using an elastomeric material. Preferably, the elastomeric materials are electrically non-conductive such that, especially when used in conjunction with the electrically non-conductive frame 14, the PCBs 12, 13 can be densely populated with electronic components 22 without the elastomeric material causing electrical interference. In a preferred embodiment, the elastomeric material is room temperature vulcanization (RTV) silicone rubber. In another preferred embodiment, the elastomeric material is thermally conductive gap filler, such as Berquist Liqui-Bond® SA 3505 (Henkel Electronics Materials, LLC, Chanhassen, Minn.). The elastomeric material provides a flexible joint between the upper PCB 12 and the frame 14, between the frame 14 and the lower PCB 13, and between an electronic component 22 and the frame 14. Additionally, the use of the elastomeric material to create the interfaces 36, 38, 40 allows for more tolerance in manufacturing parts to account for differences in height of the ridges 32 of the frame 14 and the tallest electrical component 22 on the PCBs 12, 13. In an embodiment, the tolerance is up to +/−0.005", i.e., the elastomeric material can fill in a gap in the interfaces 36, 38, 40 of up to +/−0.005". In a preferred embodiment, the tolerance can be up to +/−0.010". Preferably the tolerance is kept below +/−0.010" to reduce the thermal resistance between the electrical component(s) 22 and the frame 14. Also, advantageously, the elastomeric material can be deposited via an automated dispensing system on the ridges 32 of the frame 14, on the electronic components 22 of the PCBs 12, 13, and/or on the PCBs 12, 13 themselves.

Figure 4:
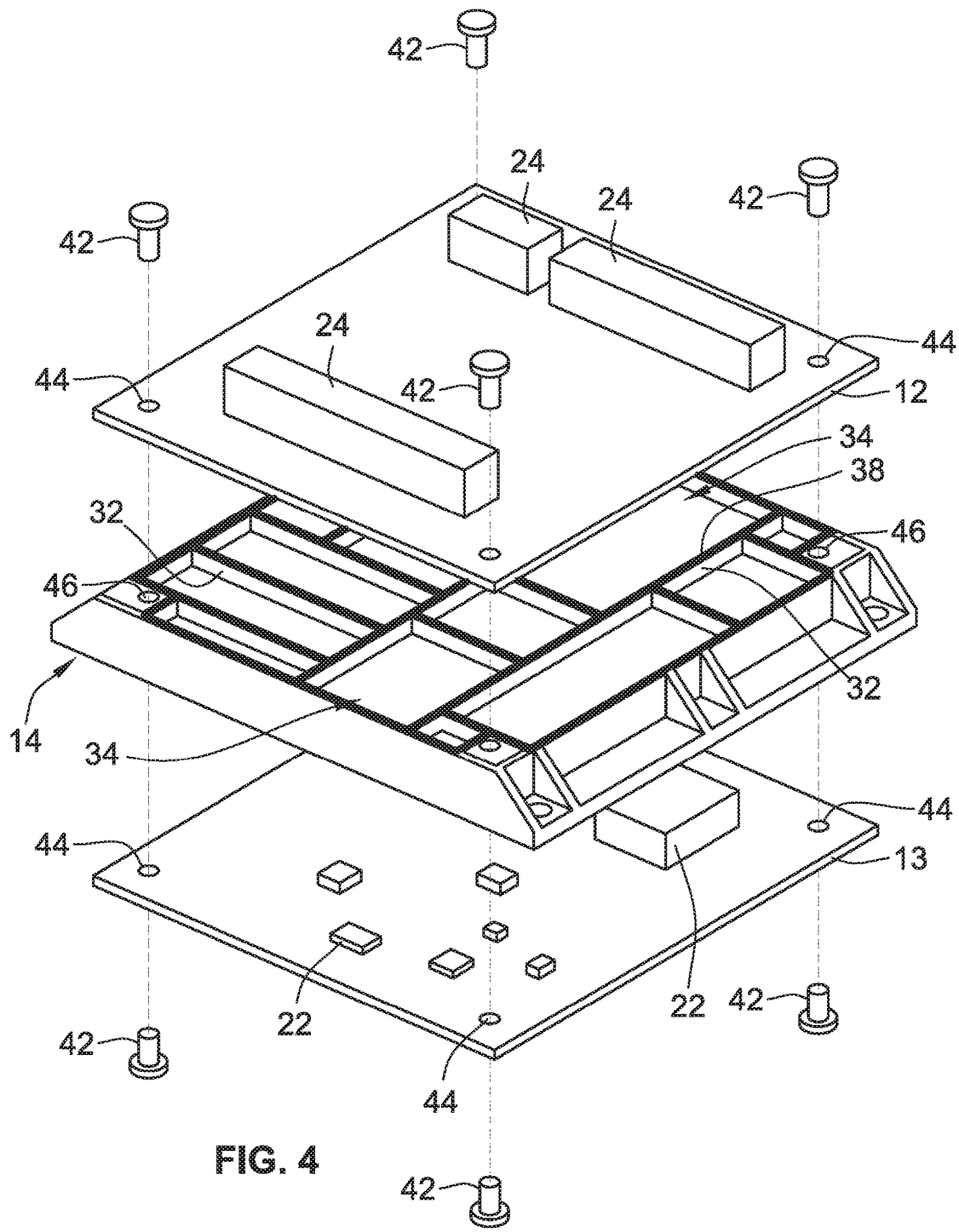
FIG. 4 is an exploded view of a PCB assembly depicting attachment of the PCBs to the frame according to an exemplary embodiment.

In conjunction with the elastomeric material, the PCBs 12, 13 and the frame 14 can also be held together using a plurality of fasteners 42 as shown in FIG. 4. As depicted in FIG. 4, the fasteners 42 are located at each of the four corners of the upper PCB 12 and the lower PCB 13. Through holes 44 are provided in the corners of the upper and lower PCBs 12, 13 such that the fasteners 42 can be inserted through the upper and lower PCBs 12, 13 into sockets 46 provided in the frame 14. The fasteners 42 can mate with the sockets 46 in a variety of suitable ways, including threaded attachment, frictional engagement, snap-fit, etc. In other embodiments, the fasteners 42, through holes 44, and sockets 46 can be provided in a greater or lesser number or at different locations on the PCBs 12, 13 and frame 14.

Figure 5:
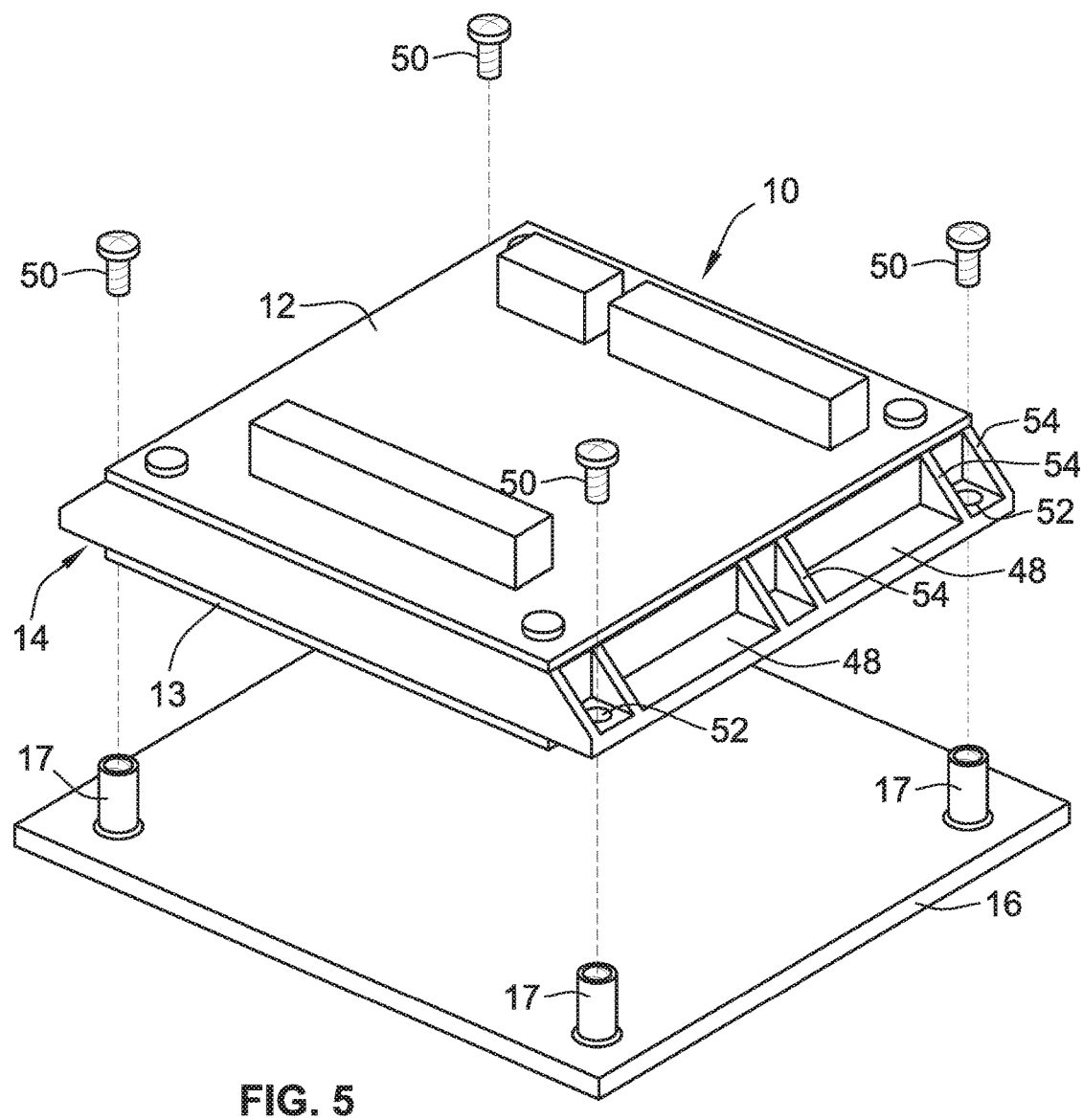
FIG. 5 is an exploded view of a PCB assembly and chassis mount according to an exemplary embodiment.

As discussed throughout this disclosure, the PCB assembly 10 generally includes the PCBs 12, 13 and the frame 14. Once these components are secured together via the elastomeric material and/or fasteners 42, the PCB assembly 10 can be mounted to a chassis 16 as illustrated in FIG. 5. As depicted in FIG. 5, the PCB assembly 10 is attached to the chassis 16 via the frame 14. Specifically, the frame 14 has at least one side that includes a flange 48. In the embodiment of FIG. 5, the frame 14 is rectangular, having four sides, with flanges 48 on two opposite sides of the frame 14. The flanges 48 are secured to the chassis 16 via fasteners 50 that engage the standoff mounts 17. The fasteners 50 are inserted through one or more openings 52 in the flanges 48. In preferred embodiments, the openings 52 are provided with reinforcement spans 54. As discussed more fully below, the size, shape, spacing, and thickness of the reinforcement spans 54 can vary; as depicted in FIG. 5, the reinforcement spans 54 are triangular in shape.

Figure 7:
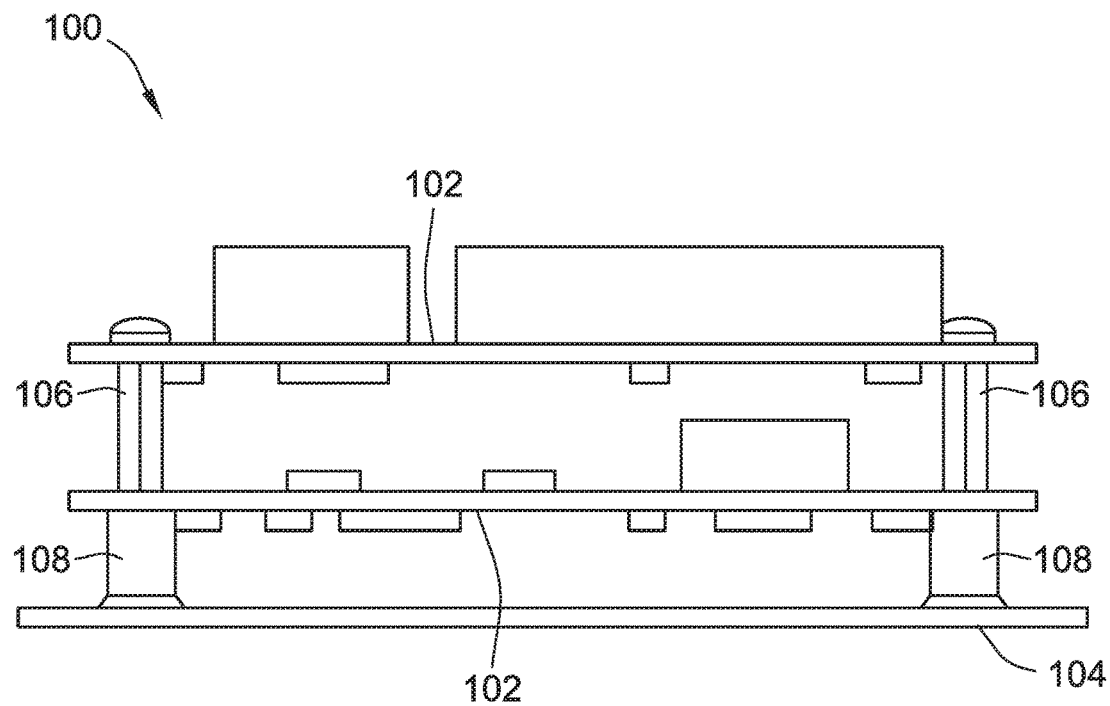
FIG. 7 is a prior art depiction of a PCB assembly in which the PCBs are mounted directly to the chassis.

As compared with a conventional PCB assembly 100 (such as depicted in FIG. 7) where the PCBs 102 are attached directly to the standoff mounts 108 of the chassis 104, the PCB assembly 10 of the disclosed embodiments (most clearly depicted in FIG. 1) is mounted to the chassis 16 via the frame 14. In this way, vibrations from the chassis 16 are not transmitted directly to the PCBs 12, 13. As such, the frame 14 provides a buffer for vibrations transmitted through the chassis 16. As mentioned above, the reinforcement spans 54 can vary in size, shape, spacing, and thickness in order to tune the level of vibrations that transfer from the chassis 16 through the frame 14. Also advantageously, the spans 54 cab be tuned for a significantly different resonant frequency compared to the resonant frequencies of the PCBs 12, 13 so that the energy coming through the mounting spans 54 does not couple with the resonant frequencies of the PCBs 12, 13.

Embodiments of the PCB assembly 10 disclosed herein provide several advantageous properties over conventional PCB assemblies, such as PCB assembly 100 shown in FIG. 7. For instance, a PCB 102 in a conventional PCB assembly 100 has a resonant frequency of approximately 250 to 300 Hz. The PCB assembly 10 as depicted, e.g., in FIG. 1 increases the resonant frequency of the PCBs 12, 13 by at least 50%. In particular embodiments, the PCB assembly 10 increases the resonant frequency by at least 90%, and in certain embodiments, the PCB assembly 10 increases the resonant frequency by as much as 130%.

Embodiments of the PCB assembly 10 as depicted, e.g., in FIG. 1 also reduce the peak shear strain at the PCBs 12, 13. PCB shear strains are on the order of 0.010 in/in for a typical industrial application. The PCB assembly 10 can reduce the peak shear strain at the PCB by at least 50% and, in some cases, by as much as 70%. Moreover, the frame 14 has the potential to provide more pockets of low strain over the areas of the PCBs 12, 13. Strain levels at the PCBs 12, 13 in operation can limit the placement of sensitive components and impact the efficiency and/or the density of the layout, driving larger PCB footprints. Thus, lowering the strain levels provides more options for the placement of sensitive components as compared to conventional PCB assemblies 100 (FIG. 7), while also maintaining usable board space for placement of electronic components 22.

Accordingly, the flexibility of electronic component 22 layout is enhanced while the footprint, or size, of the PCBs 12, 13 can be reduced.

The PCB assembly 10 of, e.g., FIG. 1 also reduces the peak deflections of the PCBs 12, 13. In a typical industrial setting under typical random industrial vibration levels, a conventional PCB assembly, such as PCB assembly 100 (FIG. 7), will experience peak deflections of approximately 0.030". In the embodiments of the PCB assembly 10 as shown, e.g., in FIG. 1, the frame 14 can reduce peak deflection by at least 50% (i.e., a peak deflection of 0.015") and, in some cases, by as much as 70% (i.e., a peak deflection of less than 0.010").

Figure 6:
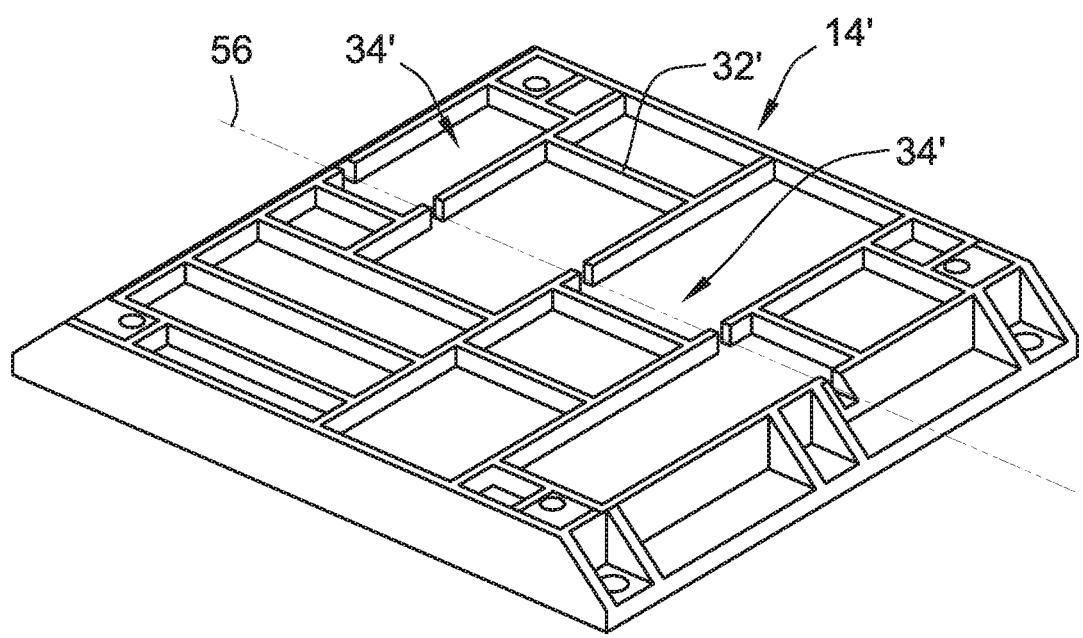
FIG. 6 depicts an isometric view of an embodiment of a PCB assembly including an air channel through the ridges according to an exemplary embodiment.

In another embodiment of the frame 14' illustrated in FIG. 6, a cooling channel (represented by dashed line 56) is provided through one or more of the ridges 32'. In this way, fluid communication is provided between the recesses 34' defined by the ridges 32'. As shown in FIG. 6, only a single cooling channel 56 is provided across one surface of the frame 14'; however, additional cooling channels 56 could be provided across the same surface in a multitude of directions and connecting a multitude of recesses 34'. Moreover, cooling channels 56 could also be provided across the opposite surface of the frame 14'. As such, a coolant, such as air, can flow through the frame 14' so as to cool electronic components (not shown) accommodated within the recesses 34'. Further, the cooling channel 56 could be filled with a tube or conduit (not shown) containing a cooling fluid, such that, as the cooling fluid flows through the tube or conduit, the cooling fluid thermally conducts heat out of the recesses 34'. Thus, this embodiment of the frame 14' provides many of the same vibration dampening advantages of the previous embodiments while also providing the additional advantage of cooling electronic components contained within the recesses 34' of the frame 14'.

All references, including publications, patent applications, and patents cited herein are hereby incorporated by reference to the same extent as if each reference were individually and specifically indicated to be incorporated by reference and were set forth in its entirety herein.

The use of the terms "a" and "an" and "the" and similar referents in the context of describing the invention (especially in the context of the following claims) is to be construed to cover both the singular and the plural, unless otherwise indicated herein or clearly contradicted by context. The terms "comprising," "having," "including," and "containing" are to be construed as open-ended terms (i.e., meaning "including, but not limited to,") unless otherwise noted. Recitation of ranges of values herein are merely intended to serve as a shorthand method of referring individually to each separate value falling within the range, unless otherwise indicated herein, and each separate value is incorporated into the specification as if it were individually recited herein. All methods described herein can be performed in any suitable order unless otherwise indicated herein or otherwise clearly contradicted by context. The use of any and all examples, or exemplary language (e.g., "such as") provided herein, is intended merely to better illuminate the invention and does not pose a limitation on the scope of the invention unless otherwise claimed. No language in the specification should be construed as indicating any non-claimed element as essential to the practice of the invention.

Preferred embodiments of this invention are described herein, including the best mode known to the inventors for carrying out the invention. Variations of those preferred embodiments may become apparent to those of ordinary skill in the art upon reading the foregoing description. The inventors expect skilled artisans to employ such variations as appropriate, and the inventors intend for the invention to be practiced otherwise than as specifically described herein. Accordingly, this invention includes all modifications and equivalents of the subject matter recited in the claims appended hereto as permitted by applicable law. Moreover, any combination of the above-described elements in all possible variations thereof is encompassed by the invention unless otherwise indicated herein or otherwise clearly contradicted by context.

What is claimed is:

1. A frame for dampening vibrations in a printed circuit board (PCB) assembly, the frame comprising:
   a substrate having a first surface and a second surface; and
   a plurality of ridges extending from at least one of the first and second surfaces, the plurality of ridges defining one or more recesses and the plurality of ridges configured to mount to a PCB;
   wherein at least one of the one or more recesses is configured to accommodate one or more electronic components of the PCB in the PCB assembly,
   wherein the plurality of ridges extend from both of the first and second surfaces.

2. The frame of claim 1, wherein the substrate is planar.

3. The frame of claim 1, wherein the substrate is a tiered structure.

4. The frame of claim 1, wherein the ridges on the first surface and the ridges on the second surface have different heights.

5. The frame of claim 1, wherein the ridges on the first surface and the ridges on the second surface have the same heights.

6. The frame of claim 1, wherein the plurality of ridges has a height that is within +/−0.010 inches of the height of the tallest electronic component of the PCB that is being accommodated.

7. The frame of claim 1, wherein the frame is injection molded.

8. The frame of claim 1, wherein the frame is comprised of a glass-filled plastic material.

9. The frame of claim 1, wherein the frame further includes at least one cooling channel that provides fluid communication through one or more of the plurality of ridges.

10. A printed circuit board (PCB) assembly, comprising:
    at least one PCB, each of the at least one PCB including one or more electronic components; and
    a frame, the frame configured to dampen vibrations transmitted to the PCB, wherein the frame includes:
    a substrate having a first surface and a second surface; and
    a plurality of ridges extending from at least one of the first and second surfaces, the plurality of ridges defining one or more recesses;
    wherein at least one of the one or more recesses is configured to accommodate an electronic component of the at least one PCB on a surface of the at least one PCB facing the frame; and
    wherein the plurality of ridges extend from both of the first and second surfaces.

11. The PCB assembly of claim 10, wherein an elastomeric material is deposited on peaks of the plurality of ridges and wherein the elastomeric material contacts the at least one PCB.

12. The PCB assembly of claim 11, wherein the elastomeric material is also deposited on at least one electronic component and wherein the elastomeric material on the electronic component contacts one of the first and second surfaces of the frame.

13. The PCB assembly of 11, wherein the elastomeric material is room temperature vulcanization silicone rubber.

14. The PCB assembly of claim 11, wherein the elastomeric material is thermal gap filler.

15. The PCB assembly of claim 10, wherein the PCB assembly is attached to a chassis via the frame such that the at least one PCB is not in direct contact with the chassis.

16. The PCB assembly of claim 15, wherein, when the PCB assembly experiences vibrations through the chassis, the frame increases a resonant frequency of the at least one PCB by at least 50%.

17. The PCB assembly of claim 15, wherein the frame increases the resonant frequency of the at least one PCB by at least 90%.

18. The PCB assembly of claim 15, wherein, when the PCB assembly experiences vibrations through the chassis, peak shear strain at the at least one PCB is less than 0.005 in/in.

19. The PCB assembly of claim 15, wherein, when the PCB assembly experiences vibrations through the chassis, the PCB has a peak deflection of less than 0.015 inches.

* * * * *